(12) United States Patent
Sotome

(10) Patent No.: US 6,764,948 B2
(45) Date of Patent: Jul. 20, 2004

(54) METHOD OF MANUFACTURING A SEMICONDUCTOR DEVICE AND THE SEMICONDUCTOR DEVICE MANUFACTURED BY THE METHOD

(75) Inventor: Yoshihiro Sotome, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/038,680

(22) Filed: Jan. 8, 2002

(65) Prior Publication Data

US 2002/0098691 A1 Jul. 25, 2002

(30) Foreign Application Priority Data

Jan. 19, 2001 (JP) ........................................ 2001-012035

(51) Int. Cl.[7] ........................... H01L 21/44; H01L 29/94
(52) U.S. Cl. ........................ 438/664; 438/682; 438/655; 257/382; 257/770
(58) Field of Search ........................ 257/382, 757–770, 257/344, 384, 755; 438/655, 664, 682, 683

(56) References Cited

U.S. PATENT DOCUMENTS

| | | | | |
|---|---|---|---|---|
| 5,883,418 A | * | 3/1999 | Kimura | 257/412 |
| 5,989,988 A | * | 11/1999 | Iinuma et al. | 438/592 |
| 6,518,631 B1 | * | 2/2003 | En et al. | 257/382 |

FOREIGN PATENT DOCUMENTS

JP          10-098012          4/1998

* cited by examiner

Primary Examiner—Matthew Smith
Assistant Examiner—Lee Calvin
(74) Attorney, Agent, or Firm—Nixon & Vanderhye P.C.

(57) ABSTRACT

A method of manufacturing a semiconductor device comprises steps of: forming a first metal film having a reducing property on a semiconductor substrate; thermal treating the resulting semiconductor substrate for reducing a native oxide film naturally formed on the semiconductor substrate and for forming a first silicide film on the semiconductor substrate; removing an unreacted first metal film selectively; forming a second metal film on the semiconductor substrate; and thermal treating the resulting semiconductor substrate for forming a second silicide film on a surface of the semiconductor substrate which includes a region where the first silicide film is formed.

14 Claims, 3 Drawing Sheets

METHOD OF MANUFACTURING A SEMICONDUCTOR DEVICE AND THE SEMICONDUCTOR DEVICE MANUFACTURED BY THE METHOD

CROSS-REFERENCE TO RELATED APPLICATION

This application is related to Japanese application No. 2001-012035 filed on Jan. 19, 2001, whose priority is claimed under 35 USC § 119, the disclosure of which is incorporated by reference in its entirety.

BACKGROUND OF THE INVENTION

1. Field of the Invention

The present invention relates to a method of manufacturing a semiconductor device including a silicide film on a surface of a semiconductor substrate and the semiconductor device manufactured by the method.

2. Description of the Related Art

In a recent semiconductor device, the performance of the device and the degree of integration are remarkably improved by the advance in minuteness of an element. Especially, in a high speed device to which a minute design rule of 0.35 $\mu$m or less gate length is applied, it is necessary to lower parasitic resistance of a diffusion layer which is formed on the surface of a semiconductor substrate as a source/drain region of a MOSFET (Metal Oxide Semiconductor Field Effect Transistor). Therefore, the surface of the diffusion layer is converted into silicide layer using a SALICIDE (Self Aligned Silicide) process. The SALICIDE process is a technique in which in general, a surface of a diffusion layer formed in a silicon substrate and a surface of a gate electrode are silicidized (converted into, for example, a metal compound comprising titanium and silicon) in a self aligned manner, so that the parasitic resistance of the diffusion layer as well as the contact resistance between a wiring layer formed on an interlayer insulating film and the diffusion layer are lowered.

When a scale-down of a gate is advanced and a gate length becomes short by the improvement in minuteness of an element, a junction depth of the diffusion layer is relatively increased to the gate length. As a result, a leak current in a lateral direction (between source and drain) is increased by a short channel effect, which causes deterioration of element characteristics. Accordingly, in the case where the gate length is made short, it is necessary to make the junction depth shallow. Under such circumstances, when the surface of the diffusion layer is converted into a silicide layer, it is necessary to form a silicide layer to be as thin as possible. That is, if the silicide layer is not made sufficiently thin relatively to the junction depth, the silicide layer itself becomes a factor to cause a leak current in the vertical direction by, for example, diffusion of metal atoms at the time of the reaction of conversion into the silicide layer. However, in the conventional minute design rule of 0.35 $\mu$m or 0.25 $\mu$m gate length, in the case where a thin silicide layer made of a titanium film is formed, a thin line effect (as line width becomes thin, sheet resistance becomes large) becomes remarkable, and the effect of using the SALICIDE technique disappears.

To this problem, in the minute design rule of 0.18 $\mu$m or less gate length, a technique using cobalt (Co) silicide layer having no thin line effect has been reviewed.

However, in the case where cobalt is used as a material of the silicide layer, differently from titanium, since cobalt does not have a reducing property to a native oxide film of the surface of a silicon substrate, there is a problem that a portion where the native oxide film exists is not silicidized, which results disadvantageously in the formation of a spotted silicide layer.

To this problem, Japanese Patent Unexamined Publication No. Hei 10(1998)-98012 proposes a method in which a titanium film is formed under a cobalt film. Hereinafter, this method will be described with reference to FIGS. 3A to 3D.

First, as shown in FIG. 3A, a field insulating film 112 for element isolation is selectively formed on a silicon substrate 111 by a normal LOCOS (Local Oxidation of Silicon) process for defining a MOSFET formation region. A gate electrode 114 made of polycrystalline silicon is formed in the MOSFET formation region through a gate insulating film 113. A low concentration impurity diffusion layer is formed by ion implanting an impurity into an active region (a region of a surface layer of the silicon substrate 111 which becomes source and drain regions) in order to form an LDD (Lightly Doped Drain) structure, and then a side wall 115 is formed on a side surface of the gate electrode 114, and further, an impurity is selectively ion-implanted into the low concentration impurity diffusion layer to form a high concentration impurity diffusion layer as a source region 116 and a drain region 117. In this time, a native oxide film ($SiO_2$) 118 are already formed on the surfaces of the source region 116, the drain region 117 and the gate electrode 114.

Next, the substrate is washed to remove the native oxide films 118 formed on the surfaces of the source region 116, the drain region 117, and the gate electrode 114. Incidentally, although the native oxide films 118 become thin by this washing, they are not actually completely removed and remain, or there is also a case where a native oxide film is again formed after the washing.

As shown in FIG. 3B, a thin titanium film 120 is formed on the whole surface of the silicon substrate in order to reduce the native oxide film, and subsequently, a cobalt film 121 for formation of silicide is formed.

Next, as shown in FIG. 3C, a RTA (Rapid Thermal Annealing) treatment is carried out, so that silicon in the surface of the gate electrode 114, the source region 116 and the drain region 117 is made to react with the cobalt film 121, so that silicide films 122 are formed.

As shown in FIG. 3D, the unreacted titanium film 120 and the unreacted cobalt film 121 on the field insulating film 112 and the side wall 115 are removed by selective etching, a second RTA treatment is further carried out in order to lower the resistance of the silicide films 122. By this, a MOSFET is formed, in which the silicide films 122 are formed in a self aligned manner only on the gate electrode 114, the source region 116 and the drain region 117.

However, in the above method, it is necessary to control the under titanium film to be thin so that the main ingredient in the silicide film becomes cobalt in order to obtain the thin and uniform silicide film having no thin line effect, but it is difficult to form such a thin film with good control and not suitable for further advancement in minuteness of the element.

Generally, a cobalt silicide film is formed to have a thickness about 3.5 times as thick as a cobalt film, and a titanium silicide film is formed to have a thickness about 2.4 times as thick as a titanium film. Thus, in order to suppress the thin line effect, it is necessary that the thickness of the titanium silicide film is controlled to be about 20 percent of the thickness of the cobalt silicide film. Accordingly, for example, if the thickness of the cobalt film is 5 nm, the thickness of the cobalt silicide film becomes about 17.5 nm, and in this case, in order to make the thickness of the titanium silicide film about 20 percent (about 3.5 nm) of the cobalt silicide film, the thickness of the titanium film is made as thin as about 1.4 nm.

Besides, since the titanium film is apt to react with oxygen, the thinner the titanium film is made, the greater the influence of an atmosphere becomes, and there is a problem that the reducing property to the native oxide film can not be expected by the influence of oxidation from the surface side of the substrate.

SUMMARY OF THE INVENTION

The present invention provides a method of manufacturing a semiconductor device comprising steps of:

forming a first metal film having a reducing property on a semiconductor substrate;

thermal treating the resulting semiconductor substrate for reducing a native oxide film naturally formed on the semiconductor substrate and for forming a first silicide film on the semiconductor substrate;

removing an unreacted first metal film selectively;

forming a second metal film on the semiconductor substrate; and thermal treating the resulting semiconductor substrate for forming a second silicide film on a surface of the semiconductor substrate which includes a region where the first silicide film is formed.

Further, according to the present invention, there is provided a semiconductor device manufactured by the above described method.

DETAILED DESCRIPTION OF THE PREFERRED EMBODIMENTS

The present invention will be described in detail with reference to the drawings.

Although the two embodiments will be exemplified to describe the manufacturing method of the present invention, the present invention is not limited to these embodiments, but various modifications can be made within the scope of the equivalent. Accordingly, in the respective embodiments, although the description has been given of the manufacturing method of the n-channel MOSFET which is constructed by converting the surface of source and drain regions into the silicide films, the method of the present invention can also be applied to a manufacturing method of, for example, a p-channel MOSFET or a CMOS (complementary MOS) FET, and further, can also be applied to a manufacturing method of a device of a MIS (Metal Insulator Semiconductor) type structure and the like.

Figure 1A:
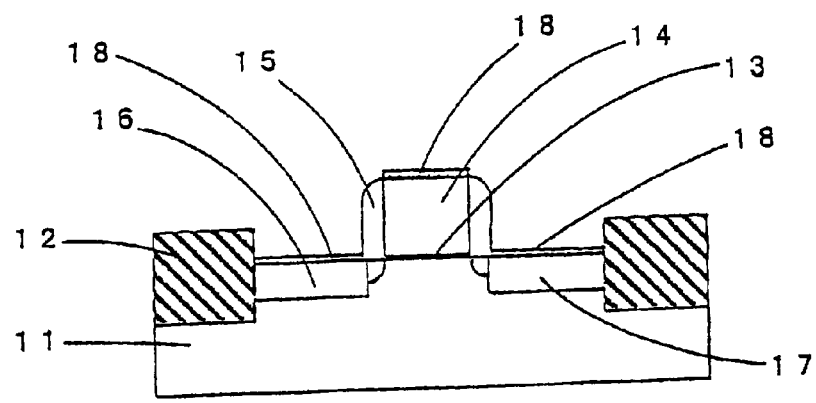
FIGS. 1A to 1D are process sectional views showing an embodiment of the present invention.

First, as shown in FIG. 1A, a field insulating film 12 for element isolation is selectively formed by a normal LOCOS process on a p-type silicon substrate 11 for defining a MOSFET formation region.

Next, the surface of the silicon substrate 11 in the MOSFET formation region is oxidized by a thermal oxidation or the like so that a gate insulating film 13 is formed to have a thickness of about 3 nm. A gate electrode layer (not shown) made of a polycrystalline silicon (polysilicon) film is formed to have a thickness of about 200 nm by a low pressure CVD method or the like. The gate electrode layer may be made to have a polycide structure in which a $WSi_x$ (tungsten silicide) layer is stacked on polycrystalline silicon. Next, a photoresist film (not shown) is formed on the gate electrode layer, and pattering is carried out by a photolithography and etching technique. The gate electrode layer is selectively etched and processed to form a gate electrode 14 using the patterned photoresist film as an etching mask.

In order to form an LDD structure, an n type impurity is ion-implanted into an active region (region of a surface layer of the silicon substrate 11 which becomes source and drain regions) to form a low concentration n type impurity diffusion layer. An insulating film (not shown) is formed on the obtained silicon substrate 11, and then the insulating film is subjected to anisotropic etching to form a side wall 15, which is required for the formation of the LDD structure, at a side surface of the gate electrode 14. Further, an n type impurity is selectively ion-implanted into the a low concentration n type impurity diffusion layer to form a high concentration n type impurity diffusion layer as a source region 16 and a drain region 17. At this time, native oxide films ($SiO_2$) 18 are already formed on the surfaces of the source region 16, the drain region 17 and the gate electrode 14.

The silicon substrate 11 is washed by, for example, a dilute hydrofluoric acid of a concentration of 1% to remove the native oxide films 18. However, although the native oxide films 18 become thin by this washing, they are not actually completely removed, or a native oxide film is again formed after the washing.

Incidentally, after the native oxide films 18 are removed, if an oxide film is uniformly formed on the substrate by dipping the whole surface of the silicon substrate in a mixed solution of, for example, ammonium hydroxide, hydrogen peroxide solution and water (e.g. 1:1:4 to 50, preferably 1:1:5) or a mixed solution of hydrochloric acid, hydrogen peroxide solution and water (e.g. 1:1:4 to 50, preferably 1:1:5), it becomes possible to suppress formation of an irregular native oxide film, and a silicide film mentioned later can be formed more uniformly, so that this is preferable.

In the above mixed solutions, it is preferable to use the mixed solution of hydrochloric acid, hydrogen peroxide solution and water in that the silicide film can be more uniformly formed.

Figure 1B:
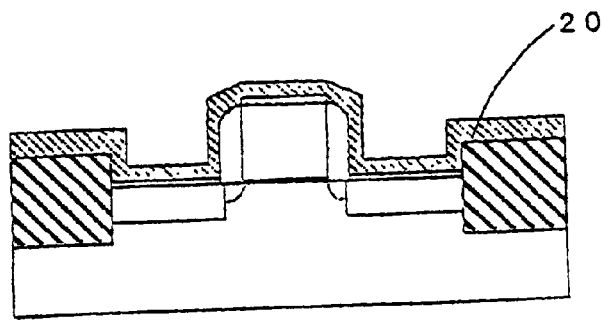

As shown in FIG. 1B, a titanium film 20 as a first metal film having a reducing property is formed to have a thickness of about 20 nm on the whole surface of the silicon substrate 11. The first metal film is formed by a well-known method, for example, sputtering, evaporating, CVD method or the like. In this embodiment, although sputtering is carried out at a substrate temperature of about 350° C., the temperature is not limited to this value, but sputtering can be normally carried out at about 500° C. or less, preferably 300 to 450° C. The first metal film is not particularly limited as long as it has a reducing property to a native oxide film, it is preferable to use a titanium film in that the effect of the present invention can be excellently obtained. Besides, the thickness of the first metal film is not particularly limited as long as the native oxide film can be sufficiently reduced and an obtained silicide film does not have the thin line effect, it is preferable that the thickness is about 10 to 40 nm.

Next, a thermal treatment is carried out so that the native oxide films 18 are reduced by the titanium film 20, and further, silicon in the silicon substrate 11 and the gate electrode 14 is made to react with titanium in the titanium film 20 by diffusion control (diffusion limited) to obtain a titanium silicide film 25 of about 3 nm-thickness.

When the first metal film is formed, the substrate is usually heated to 500° C. or lower as described above. Accordingly, the above-mentioned thermal treatment may be performed by utilizing the heating of the substrate at the formation of the first metal film. Or the thermal treatment may be carried out by raising the temperature of the substrate to about 500° C. or lower, preferably about 200 to 400° C. separately from the formation of the first metal film. The thickness of the titanium silicide film 25 is preferably 1 to 10 nm, and more preferably 2 to 5 nm.

The unreacted part of the titanium film 20 is selectively removed.

The removal of the unreacted part of the first metal film can be carried out by a well-known method, for example, wet etching or the like. The wet etching is carried out by using, for example, a mixed solution of sulfuric acid and hydrogen peroxide solution of 4:1.

Figure 1C:
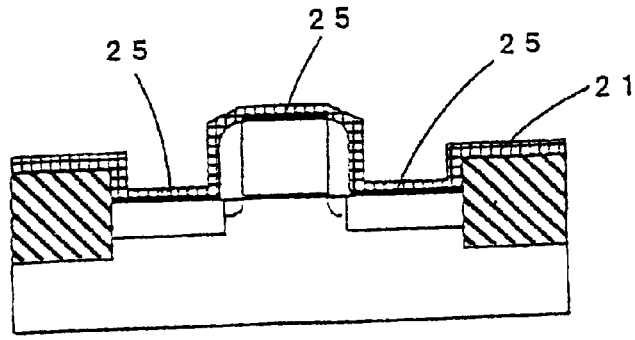

Next, as shown in FIG. 1C, a cobalt film 21 as a second metal film is formed to have a thickness of about 5 nm on the whole surface of the silicon substrate 11.

The second metal film is formed by, similarly to the first metal film, a well-known method, for example, sputtering or the like.

For example, a cobalt film, a nickel film or the like is cited as the second metal film, among which the cobalt film is preferred in that the thin line effect does not occur. The thickness of the cobalt film is preferably about 1 to 10 nm, more preferably about 3 to 8 nm.

Figure 1D:
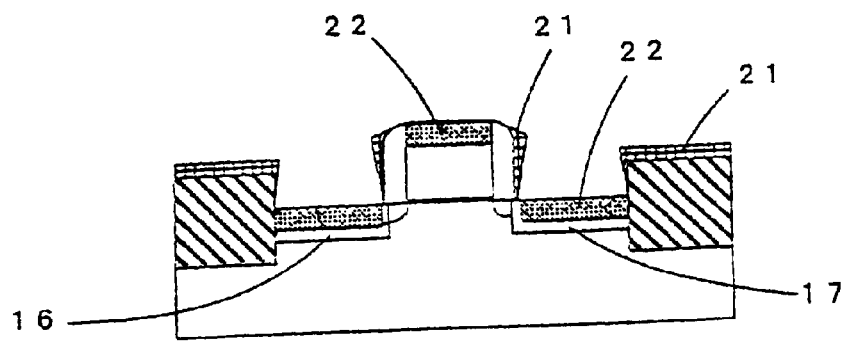

Next, a thermal treatment is carried out by an RTA treatment under the conditions of a nitrogen atmosphere, atmospheric pressure, 550° C. and 60 seconds so that silicon in the gate electrode 14, the source region 16 and the drain region 17 is made to react with cobalt in the cobalt film 21. As shown in FIG. 1D, silicide films 22 are formed to have a thickness of about 17.5 nm on the surface of the gate electrode 14, the source region 16 and the drain region 17.

A method of carrying out the thermal treatment is suitably selected and adopted from well-known methods, e.g. furnace anneal, laser anneal, lamp anneal (e.g. RTA: rapid thermal anneal), EB anneal and the like in accordance with the material and the like of the second metal film used. The conditions of the thermal treatment are adjacent depending on the material and the thickness of the second metal film, etc. For example, the condition under a nitrogen atmosphere, hydrogen atmosphere, air and the like; at atmospheric pressure, reduced pressure or high pressure; in the range of 400 to 800° C.; and for 5 seconds to 60 minutes are mentioned.

It is preferable that the thickness of the obtained silicide film is about 3.5 to 35 nm. The silicide film is comprised mainly of a silicide of the second metal of the second metal film, but may contain a silicide in which the first metal of the first metal film is alloyed uniformly or ununiformly with silicon. In this case, it is preferable that the silicide of the first metal and of the second metal are incorporated in the obtained silicide film.

Since it is hard to allow the silicon oxide film to react with the cobalt film, the silicide film is not formed on the field insulating film 12 and the side wall 15, and the unreacted cobalt film 21 remains. Thus, although not shown, the unreacted cobalt film 21 on the field insulating film 12 and the side wall 15 is selectively wet etched and removed by, for example, a mixed solution of sulfuric acid and hydrogen peroxide solution of 4:1.

Next, for the purpose of lowering the resistance of the silicide film 22, a second RTA treatment can be carried out, for example, in a nitrogen atmosphere at atmospheric pressure at 700° C. for 30 seconds.

Each thermal treatment may be carried out under the same conditions as mentioned above. In this way, the silicide films 22 are formed in the self aligned manner only on the gate electrode 14, the source region 16 and the drain region 17.

Thereafter, an interlayer insulating film, a wiring layer, a contact between the substrate and a wiring line, a protection film and the like are formed, thus an n-channel type MOS-FET is manufactured.

Another embodiment of the present invention will be described with reference to the drawings.

Figure 2A:
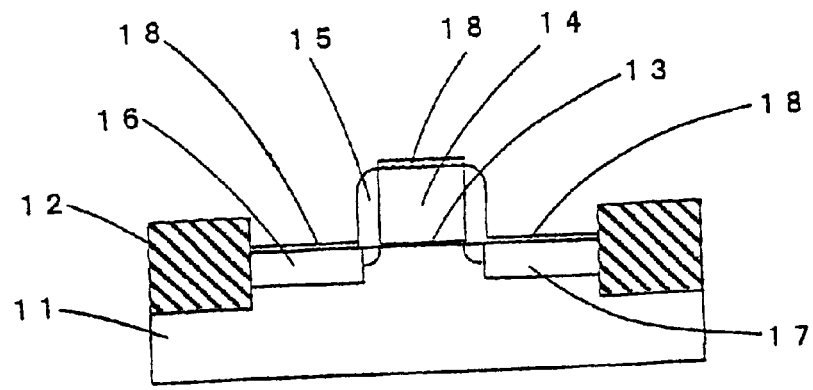
FIGS. 2A to 2D are process sectional views showing another embodiment of the present invention.
Figure 2B:
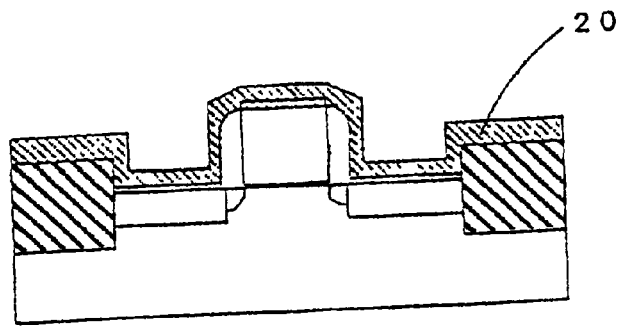

Since steps (FIGS. 2A, 2B and 2C) up to a step in which a titanium film 20 is formed are carried out in the same way as the former embodiment (FIGS. 1A, 1B and 1C), the description is omitted.

Figure 2C:
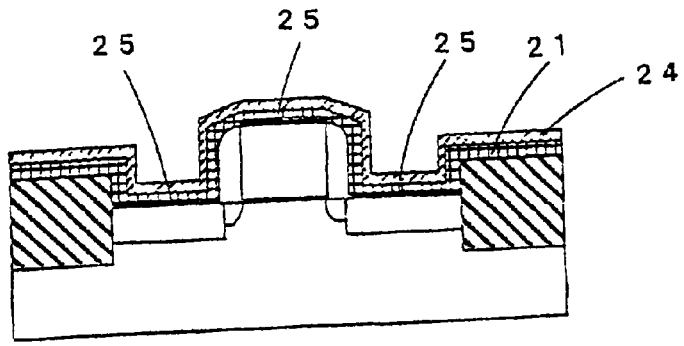
Figure 2D:
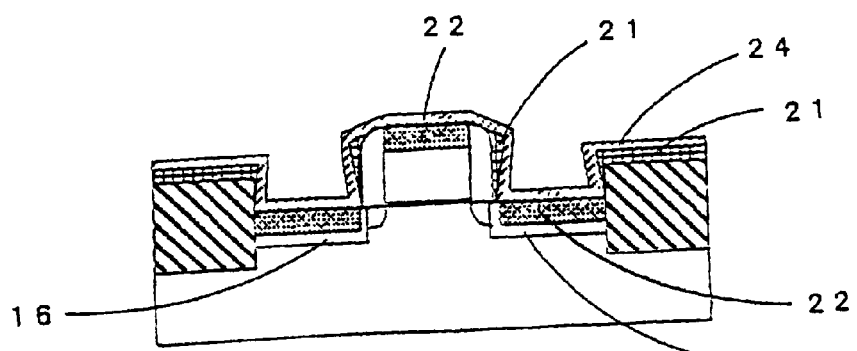
Figure 3A:
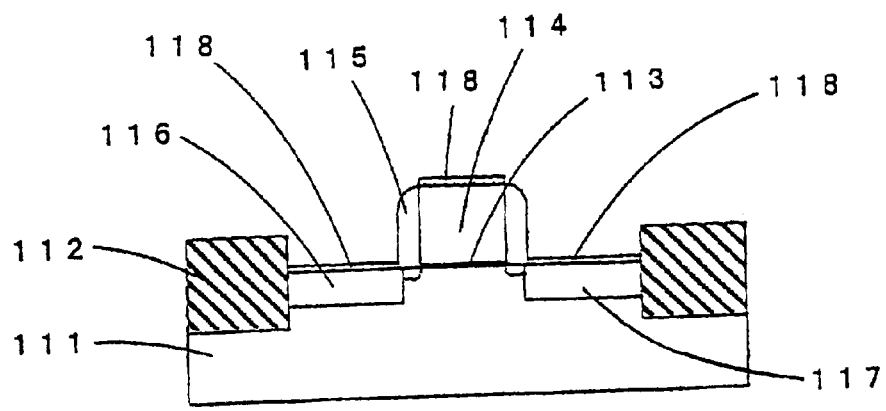
FIGS. 3A to 3D are process sectional views showing an embodiment of conventional process.
Figure 3B:
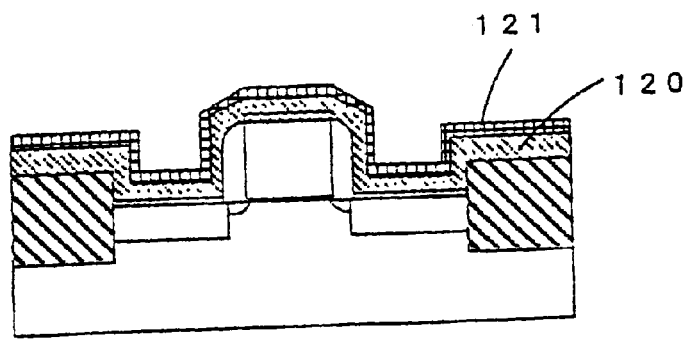
Figure 3C:
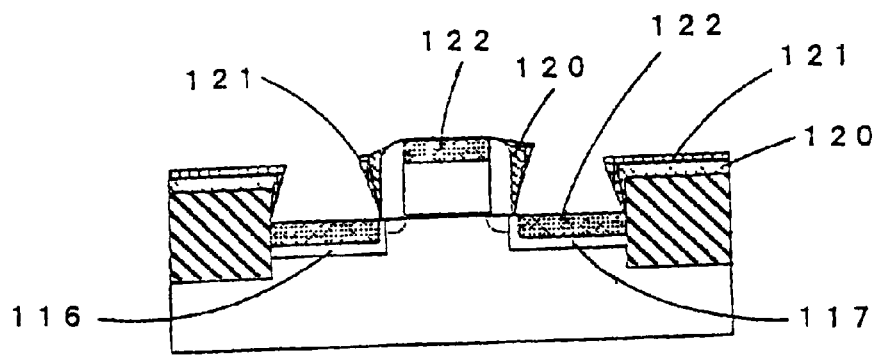
Figure 3D:
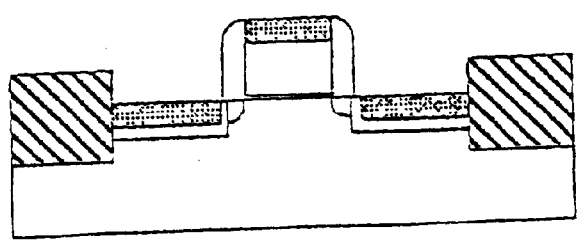

As shown in FIG. 2C, a cobalt film 21 as a second metal film is formed to have a thickness of about 5 nm on the whole surface of a silicon substrate 11, a titanium nitride film (TiN film) 24 as a protection film is further formed thereon to have a thickness of about 30 nm.

By forming the protection film, it is possible to prevent the second metal film from being once exposed to the air and oxidized during transport to an annealing apparatus in a subsequent RTA treatment step, and it is possible to effectively prevent oxygen from being taken into the silicide film. Thus, it is further effective in lowering of the resistance of the silicide film.

The protection film is not particularly limited as long as it is etched similarly to the unreacted second metal film, for example, a nitride film may be mentioned, a titanium nitride film is preferable. It is preferable that the thickness of the protection film is about 20 to 40 nm.

Next, a thermal treatment is carried out so that silicon in a gate electrode 14, a source region 16 and a drain region 17 is made to react with the cobalt film 21, so that silicide films 22 which mainly includes a cobalt silicide are formed on the surface layers of the silicon substrate and the gate electrode.

And then, the unreacted cobalt film 21 and titanium nitride film 24 are removed by wet etching of, for example, a mixed solution of sulfuric acid and hydrogen peroxide solution of 4:1.

Other steps are the same as the former embodiment.

As described above, according to the method of manufacturing the semiconductor device of the present invention, the first metal film having the reducing property is formed on the semiconductor substrate before the silicide film is formed and the thermal treatment is carried out so that the under native oxide film is reduced. Thus, it is possible to avoid such disadvantages that the silicide film is not formed by the existence of the native oxide film or the thickness of the silicide film becomes irregular.

Besides, since the silicide film made of the semiconductor substrate and the first metal film can be formed to be thin by diffusion control, and since conversion into silicide is carried out by forming the second metal film after the unreacted first metal film is removed, the thin line effect caused by the first metal film can also be avoided.

Besides, the thermal treatment is carried out to reduce the native oxide film by the first metal film, so that the thickness of the silicide film on the substrate can be made thin and sufficiently uniform. Besides, since the titanium silicide film can be formed to be thin by the diffusion control, in the finally obtained silicide film, it becomes possible to suppress the titanium silicide component to be low as compared with the cobalt silicide component. By this, it becomes possible to lower the fluctuation of sheet resistance including a thin line portion, and it also becomes unnecessary to control the thickness of the titanium film to be not larger than the thickness of the cobalt film.

Therefore, according to the method of the present invention, in future, in accordance with the development in the shallow junction of a MOSFET in which its source and drain are converted into silicide, the silicide film containing cobalt silicide as its main ingredient can be formed to be thin and uniform by the simple method, and accordingly, the thin line effect and the junction leak do not occur, and the parasitic resistance of a diffusion region, a gate region and a contact portion can be lowered.

What is claimed is:

1. A method of manufacturing a semiconductor device, the method comprising:
   forming a first metal film having a reducing property on a semiconductor substrate;
   thermal treating the semiconductor substrate and the first metal film supported thereon for reducing a native oxide film naturally formed on the semiconductor substrate and for forming a first silicide film on the semiconductor substrate in at least a source/drain region;
   after forming the first silicide film via the first metal film in the source/drain region, removing an unreacted portion of the first metal film;
   forming a second metal film on the semiconductor substrate over and contacting at least the first silicide film; and
   thermal treating the semiconductor substrate and the second metal film supported thereon for forming a second silicide film on a surface of the semiconductor substrate in at least said source/drain region which includes a region where the first silicide film is formed.

2. A method of manufacturing a semiconductor device according to claim 1, wherein the first metal film comprises titanium.

3. A method of manufacturing a semiconductor device according to claim 1, wherein the second metal film comprises cobalt.

4. A method of manufacturing a semiconductor device according to claim 1, wherein said thermal treating for reducing the native oxide film and forming the first silicide film is carried out at a temperature of 500° C. or less.

5. A method of manufacturing a semiconductor device according to claim 4, wherein the first silicide film is formed to have a thickness of 1 to 10 nm.

6. A method of manufacturing a semiconductor device according to claim 1, wherein the second metal film is formed to have a thickness of 1 to 10 nm.

7. A method of manufacturing a semiconductor device according to claim 1, further comprising a step of forming a protection film after the step of forming the second metal film and before the step of heat-treating for forming a second silicide film.

8. A method of manufacturing a semiconductor device according to claim 7, wherein the protection film is a titanium nitride film.

9. A method of manufacturing a semiconductor device according to claim 1, further comprising a step of oxidizing the semiconductor substrate in a mixed solution of hydrochloric acid, hydrogen peroxide solution and water before the step of forming the first metal film.

10. A method of manufacturing a semiconductor device according to claim 1, further comprising heating the substrate when the first metal film is formed and this heating of the substrate also serves as the thermal treating for reducing the native oxide film and forming the first silicide film.

11. A method of manufacturing a semiconductor device according to claim 1, wherein a MOSFET is formed.

12. A semiconductor device manufactured by a method comprising:
    forming a first metal film having a reducing property on a semiconductor substrate;
    thermal treating the resulting semiconductor substrate for reducing a native oxide film naturally formed on the semiconductor substrate and for forming a first silicide film on the semiconductor substrate;
    removing an unreacted first metal film selectively;
    forming a second metal film on the semiconductor substrate; and
    thermal treating the resulting semiconductor substrate for forming a second silicide film on a surface of the semiconductor substrate in at least a source/drain region of the semiconductor device which includes a region where the first silicide film is formed.

13. A method of making a semiconductor device, the method comprising:
    forming a first metal inclusive film having a reducing property over at least a semiconductor substrate;
    after forming the first metal inclusive film, thermal treating at least the semiconductor substrate to reduce a native oxide film formed over at least the semiconductor substrate and to form a first silicide film over at least the semiconductor substrate;
    forming a second metal inclusive film over at least semiconductor substrate and contacting the first silicide film; and
    after forming the second metal inclusive film, thermal treating at least the semiconductor substrate to form a second silicide film on at least a source/drain region of the semiconductor device which includes a region where the first silicide film was formed.

14. The method of claim 13, further comprising removing at least part of an unreacted portion of the first metal film after forming the first silicide film but before forming the second silicide film.

* * * * *